United States Patent
Kulik et al.

(10) Patent No.: US 6,665,185 B1
(45) Date of Patent: Dec. 16, 2003

(54) APPARATUS AND METHOD FOR EMBEDDED FLUID COOLING IN PRINTED CIRCUIT BOARDS

(75) Inventors: Andreas Kulik, Plainville, MA (US); Andrew Roemer, Pomfret Center, CT (US)

(73) Assignee: LTX Corporation, Westwood, MA (US)

( * ) Notice: Subject to any disclaimer, the term of this patent is extended or adjusted under 35 U.S.C. 154(b) by 0 days.

(21) Appl. No.: 10/267,964

(22) Filed: Oct. 9, 2002

(51) Int. Cl.[7] ................................. H05K 7/20
(52) U.S. Cl. ................. 361/699; 361/689; 361/694; 361/698; 257/714; 174/15.1; 174/252; 165/80.4; 428/166; 428/188
(58) Field of Search ................. 361/698, 699, 361/702, 704, 711, 719, 721, 748, 760, 790; 257/714; 174/15.1, 252; 165/80.4, 104.33; 428/166, 188

(56) References Cited

U.S. PATENT DOCUMENTS

| | | | |
|---|---|---|---|
| 3,746,942 A | 7/1973 | Brown et al. | |
| 4,392,153 A | 7/1983 | Glascock, II et al. | |
| 4,573,067 A | 2/1986 | Tuckerman et al. | |
| 4,859,520 A | * 8/1989 | Dubuisson et al. | 428/137 |
| 5,049,973 A | 9/1991 | Satriano et al. | |
| 5,239,200 A | 8/1993 | Messina et al. | |
| 5,345,107 A | 9/1994 | Daikoku et al. | |
| 5,373,417 A | 12/1994 | Barrett | |
| 5,380,956 A | * 1/1995 | Loo et al. | 174/252 |
| 5,448,580 A | 9/1995 | Birx et al. | |
| 5,478,972 A | 12/1995 | Mizutani et al. | |
| 5,701,751 A | 12/1997 | Flores | |
| 5,719,444 A | 2/1998 | Tilton et al. | |
| 5,763,951 A | * 6/1998 | Hamilton et al. | 257/714 |
| 5,880,931 A | 3/1999 | Tilton et al. | |
| 6,101,941 A | 8/2000 | Aubert et al. | |
| 6,105,661 A | 8/2000 | Torii | |
| 6,141,214 A | 10/2000 | Ahn | |
| 6,186,660 B1 | * 2/2001 | Kopf-Sill et al. | 366/340 |
| 6,313,992 B1 | 11/2001 | Hildebrandt | |
| 6,377,457 B1 | * 4/2002 | Seshan et al. | 361/690 |

FOREIGN PATENT DOCUMENTS

JP   02121355 A  *  5/1990  ......... H01L/23/473

* cited by examiner

*Primary Examiner*—Boris Chervinsky
(74) *Attorney, Agent, or Firm*—McDermott, Will & Emery

(57) ABSTRACT

A circuit board cooler employs a closed fluid delivery system to transfer heat from electronic components to a cooling fluid. One or more channels embedded within the circuit board carry cooling fluid to the components where the fluid absorbs heat from the component, then away from the component to deposit the excess thermal energy in a thermal sink, such as a heat exchanger. The cooling system may employ conductive thermal transfer elements, such as "thermal vias", to enhance heat transfer from electronic components to the cooling fluid.

29 Claims, 3 Drawing Sheets

US 6,665,185 B1

APPARATUS AND METHOD FOR EMBEDDED FLUID COOLING IN PRINTED CIRCUIT BOARDS

FIELD OF THE INVENTION

The present invention relates to the cooling of electronics, and more particularly to high capacity cooling systems for electronics located on circuit boards.

BACKGROUND OF THE INVENTION

As electronics systems continue to decrease in size and increase in performance (with a concomitant increase in power consumption), power density becomes a major design issue. That is, electronic circuits operate efficiently and effectively only over a prescribed temperature range. Operating outside this range can degrade and even destroy the circuit. Although there are many performance and price motivations for packing as much circuitry into as small a volume as possible, packing too much circuitry into a given volume creates a power density that could destroy the electronic circuitry. Many electronic circuit cooling systems, both active and passive have been employed over the years to varying degrees of effectiveness. U.S. Pat. Nos. 5,719,444; 6,313,992 B1; 5,880,931; 5,701,751; 4,392,153; 4,573,067; 5,239,200; 5,345,107; 5,049,973; 5,373,417; 6,141,214; 6,105,661; 6,190,941; 6,101,094; and 3,746,942 disclose various cooling systems and methods for electronics systems and are all hereby incorporated by reference.

Notwithstanding the performance afforded by conventional circuit board cooling systems, a circuit board cooling system that provides high capacity cooling at a relatively low cost, and which occupies very little space would be highly desirable.

SUMMARY OF THE INVENTION

A circuit board cooler employs a closed fluid delivery system to transfer heat from electronic components to a cooling fluid. A fluid cooling system in accordance with the principles of the present invention includes one or more channels embedded within a circuit board that supports electronic components to be cooled. The electronic components may be discrete components, such as capacitors, resistors, or inductors, or integrated circuits, for example. Additionally, the components may be surface-mounted or through-hole mounted components. Each channel carries cooling fluid to and from at least one component. The cooling fluid absorbs excess thermal energy from the component and disposes of the excess heat using any of a variety of methods including the use of active or passive devices, such as heat exchangers or heatsinks, for example. After cooling, the fluid may be re-circulated for further cooling of the component of interest. Each circuit board layer may include a substrate having first and second surfaces and composed of a dielectric material, for example, with copper deposited on one or both of the first and second surfaces (also referred to herein as "top" and "bottom" surfaces). The deposited copper may also be referred to herein as a layer, although it may be patterned to form, not a sold layer of copper as for a power or ground plane, but, traces for the inter-connection of electronic devices.

Each cooling channel may be formed as a void in an inner layer of a multi-layer circuit board, with inlet and outlet ports formed in one or more adjoining layers for the introduction and evacuation, respectively, of the cooling fluid. A plurality of cooling channels may be formed in an individual circuit board. Circuit boards having a plurality of channels may have one or more channels formed in each of a plurality of layers. One or more thermal conduction enhancements, such as "thermal vias", for example, may be employed to improve the heat transfer efficiency between the electronic component being cooled and the cooling fluid within a channel.

A circuit board cooler in accordance with the principles of the present invention may be particularly effective at cooling electronic components supported on both sides of a circuit board.

BRIEF DESCRIPTION OF THE DRAWINGS

The foregoing and other objects of this invention, the various features thereof, as well as the invention itself, may be more fully understood from the following description, when read together with the accompanying drawings as described below.

DETAILED DESCRIPTION

Figure 1:
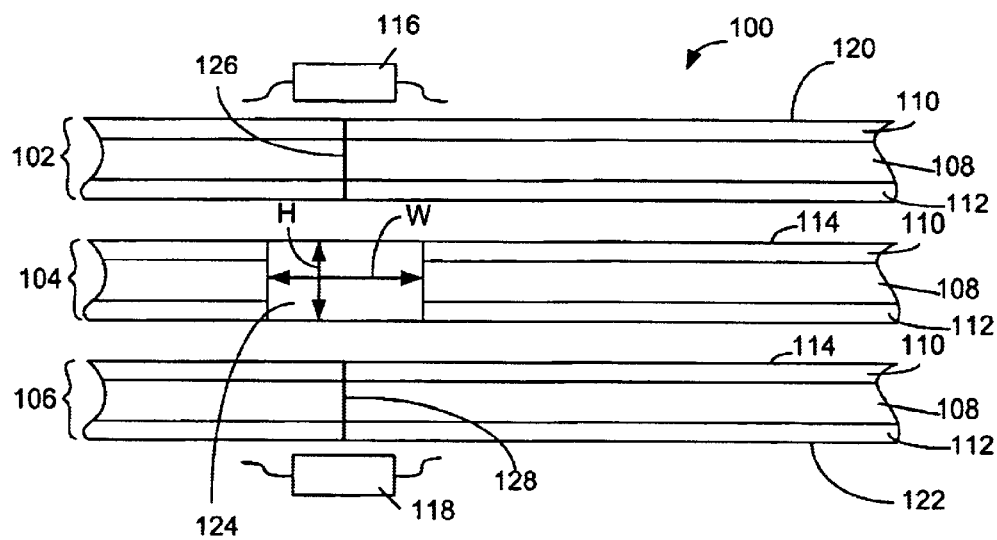
FIG. 1 is an exploded view of a multi-layer circuit board with an embedded cooling channel in accordance with the principles of the present invention.

A circuit board cooler employs a closed fluid delivery system to transfer heat from electronic components to a cooling fluid. A fluid cooling system in accordance with the principles of the present invention includes one or more channels embedded within a circuit board that supports electronic components to be cooled. The electronic components may be discrete components, such as capacitors, resistors, or inductors, or integrated circuits, for example. The exploded side view of FIG. 1 illustrates a segment of a multi-layer circuit board 100 in accordance with the principles of the present invention. In this illustrative embodiment the circuit board 100 includes three layers 102, 104, and 106. Each layer includes a substrate 108 that supports "top" and "bottom" copper layers, 110 and 112, respectively. A substrate 108 may be composed of a dielectric material and may be included within a multi-layer circuit board with no copper layers, with a copper layer on only one surface, or with a copper layer on both major surfaces. Since each copper layer may be patterned to form a sold layer of copper, as for a power or ground plane, or traces for the inter-connection of electronic devices, which may be surface-mounted or through-hole mounted components, for example. The conductive layers supported by a substrate need not be composed of copper, but copper, or a copper alloy, is typically employed for various reasons, including a relatively high conductivity-to-cost ratio.

An epoxy resin 114 may be used to join a plurality of layers to form a multi-layer circuit board. Such a circuit board formation may be accomplished using any of a number of processes known in the art, one of which is discussed in U.S. Pat. No. 5,478,972 issued to Mizutani et al., which is hereby incorporated by reference. Electronic components, such as components 116 and 118, may be placed on the top 120 and/or bottom 122 surfaces of the circuit board 100. The electronic components may be discrete components, such as capacitors, resistors, or inductors, or integrated circuits, and they may be surface-mounted or through-hole mounted components, for example.

Although the dielectric, copper, and resin layers may be of any thickness, they are typically on the order of 490, 1.4, and 3 mils thick, respectively. A void 124 is formed in the middle layer 104 of the multi-layer circuit board before the layers are joined to form a multi-layer circuit board. The void is such that it forms a channel between the two outer layers 102 and 106 when the multi-layer board is formed. Channels may be formed by creating voids that do not extend to a layer's edge, thereby leaving intact portions of the layer (that is, dielectric substrate and copper cladding, if cladding is used), to form channel stops. A void may be formed by cutting a portion out of the layer 104, for example. All channels/voids illustrated in FIGS. 1 through 4 are shown from an "end on" view. The width, W, of a channel may vary according to the mechanical, electrical and thermal properties of a specific board layout and the height, H, will typically be that of a layer's thickness, approximately 500 mil, for the example of layer 104.

Figure 4:
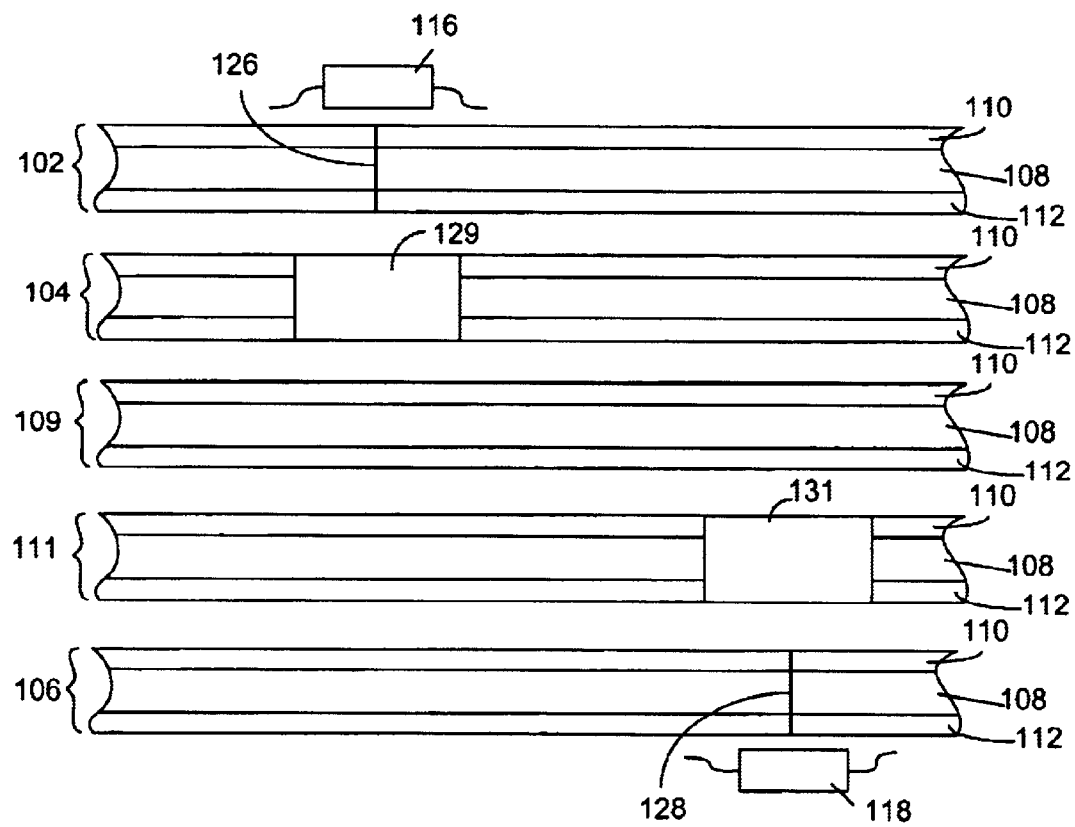
FIG. 4 is an exploded view of a multi-layer circuit board with a plurality of embedded cooling channels in accordance with the principles of the present invention.
Figure 5:
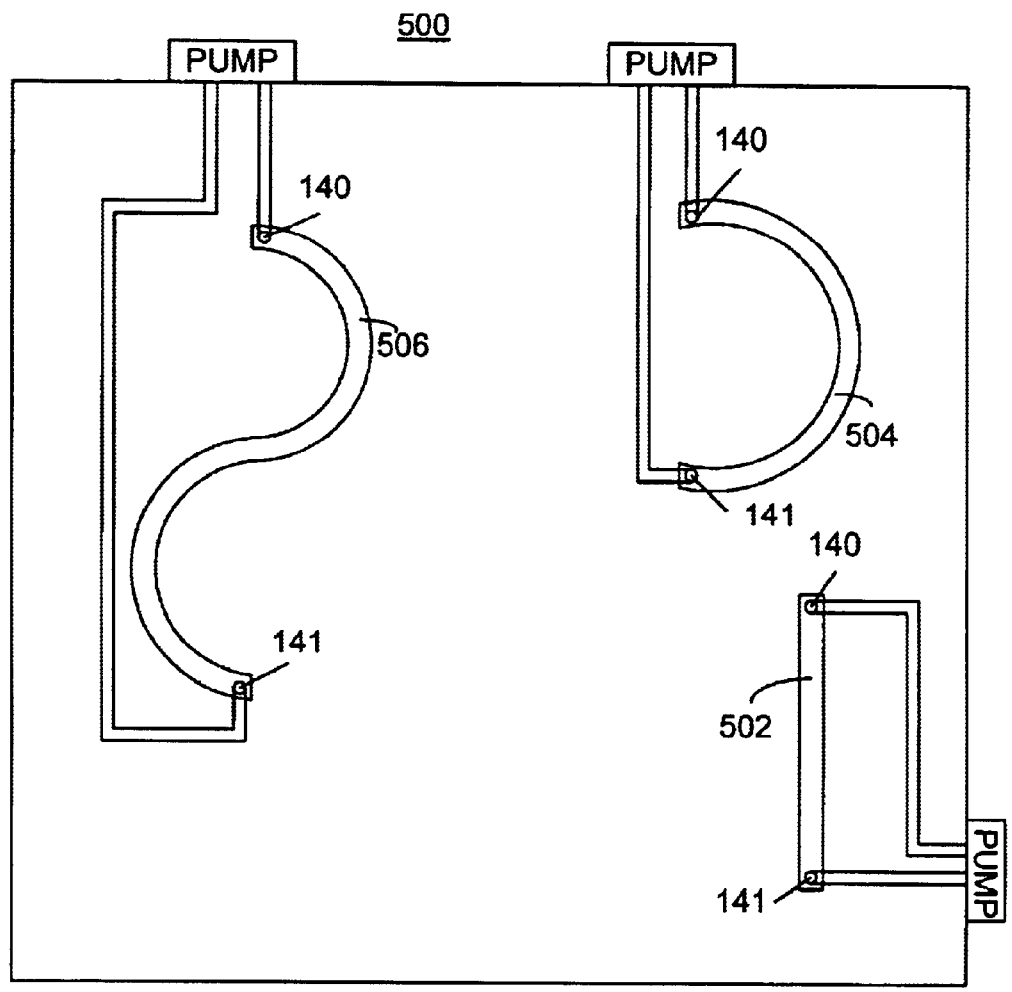
FIG. 5 is a top plan view of a circuit board layer having voids formed therein such as may be employed to form one or more embedded cooling channels within a multi-layer circuit board.

One or more inlets 140 and outlets 141 (as shown in FIG. 5, and not shown in FIGS. 1–4) may be formed through one or more of the layers adjoining the void to thereby provide fluid inlet and outlet ports to the cooling channel. Inlet and outlet ports may be formed through the same adjoining layer or through opposite adjoining layers. Each channel carries cooling fluid to and from at least one component. The cooling fluid absorbs excess thermal energy from the component and disposes of the excess heat using any of a variety of methods including the use of active or passive devices, such as heat exchangers or heatsinks, for example. After cooling, the fluid may be re-circulated for further cooling of the component of interest. A pump may be used to impel cooling fluid from the one or more inlet ports, through the channel, then out the one or more outlet ports. The cooling fluid may be a nonflammable, nonconductive fluid, such as Flourinert™, available from 3M Company, St. Paul Minn.

A plurality of cooling channels may be formed in an individual circuit board. Circuit boards having a plurality of channels may have one or more channels formed in each of a plurality of layers. A single channel may be formed by connecting one or more voids, such as void 124, within a layer with one or more voids in one or more other layers to form a multi-layer channel. A channel may be formed in one or both exterior layers 102, 106 by creating a void within respective interior copper 112 and 110 and dielectric 108 sub-layers, while leaving respective exterior 110 and 112 copper layers intact. The respective exterior 110 and 112 intact copper layers would then form a "cap" for the channel. Additionally, the close proximity of cooling fluid to the copper cap and the high thermal conductivity of the copper cap would increase the thermal transfer efficiency from the one or more components being cooled to the cooling fluid contained within the channel. By "intact copper layer" we mean that at least enough copper to seal the channel remains after the void is formed. Additionally, the channel "cap" may be formed of any material, but, the use of copper would be particularly convenient, especially in an application where the copper also forms a circuit element, such as a ground or power plane. One or more thermal conduction enhancements, such as "thermal vias" 126, 128 in FIGS. 1, 2, and 4, and 126, 128, 130, and 132 in FIG. 3, for example, may be employed to improve the heat transfer efficiency between the electronic component being cooled and the cooling fluid within a channel. Various types of thermal vias are known. Some are described, for example, in U.S. Pat. No. 6,190,941 issued Feb. 20, 2001 to Heinz, et al., which is hereby incorporated by reference in its entirety.

Figure 2:
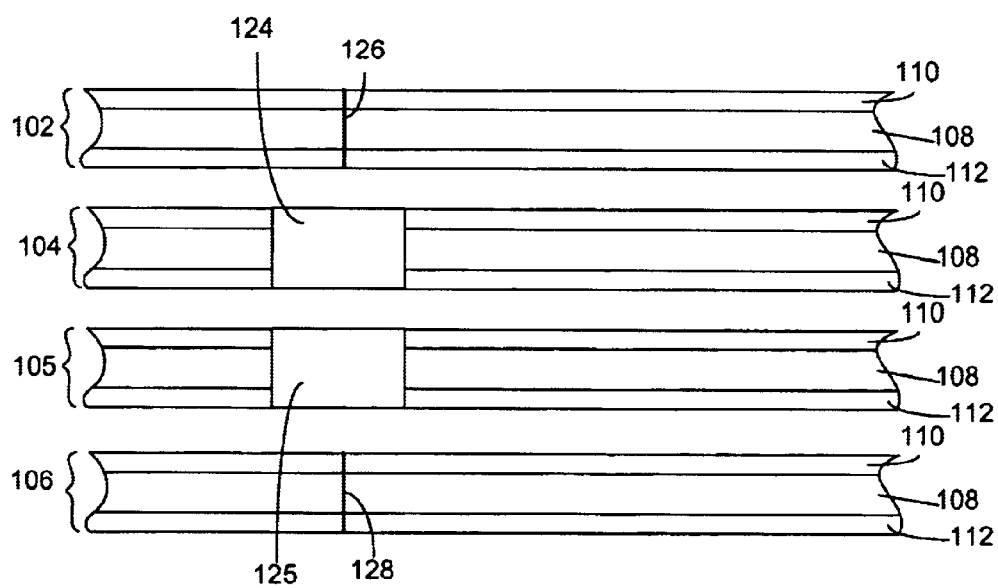
FIG. 2 is an exploded view of a multi-layer circuit board with a deep embedded cooling channel in accordance with the principles of the present invention.

The exploded sectional view of FIG. 2 illustrates the basic elements of a multi-layer circuit board with embedded cooling channel in accordance with the principles of the present invention. In this illustrative embodiment, a plurality of interior layers include voids that, when all the layers are combined into a single printed circuit board, form a deeper channel than would be possible using a single layer of the same thickness. That is, a layer 105 includes a void 125 that coincides with the void 124. The voids 124 and 125 may have substantially the same outline and substantially overlap to form a continuous, deep, channel, for example. Additionally, whether the voids have substantially the same overall outline or not, each void may be broken up into smaller voids by "inclusions" of the layer within which the void is formed. That is, rather than cutting the same pattern out of all layers, one or more portions of the pattern may be cut from one or more layers to channel segments in one or more layers. The channel segments may be formed in proximity to the location of electronic components that have a critical cooling requirement, thereby permitting the cooling fluid to absorb heat from locations of critical need, without absorbing heat from components whose thermal dissipation may be handled by other means.

Figure 3:
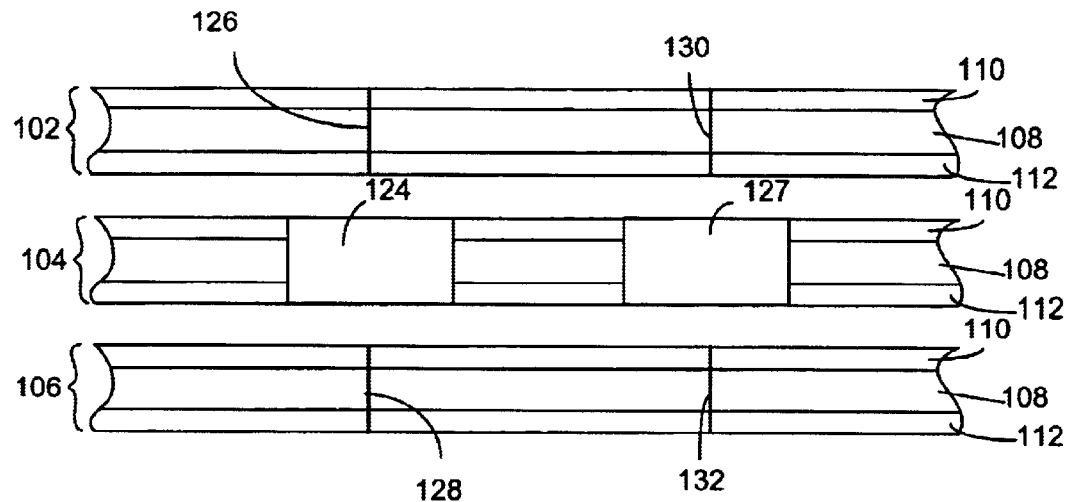
FIG. 3 is an exploded view of a multi-layer circuit board with an embedded cooling channel in accordance with the principles of the present invention.

The exploded sectional view of FIG. 3 illustrates a multi-layer circuit board having a plurality of cooling channels within the same circuit-board layer in accordance with the principles of the present invention. The channel-forming voids 124,127 have thermal vias 126,128 and 130, 132 respectively associated with them. As with other embodiments, each channel may have more than one thermal vias and the thermal vias may be formed in either of the adjoining layers 102 or 106. Additionally, the channels formed by the voids may be linked to form a single channel, in which case, a single inlet port and a single outlet port may be employed to supply cooling fluid throughout the entire, combined, channel.

The exploded sectional view of FIG. 4 illustrates a multi-layer circuit board having non-overlapping channels formed in a plurality of inner layers. Voids 129 and 131 are respectively formed in layers 104 and 111, and the board includes a layer 109 that intervenes between layers 104 and 111. If a void (not show) within the intervening layer 109 connects the voids 129 and 131, a single multi-layer channel may be formed and an inlet port on one exterior surface may be used to supply fluid coolant through the channel to an outlet port on the other exterior surface. Either port, 140 or 141, may act as an inlet or an outlet port.

The top plan view of FIG. 5 provides a view of a circuit board having a variety of buried cooling channels in accordance with the principles of the present invention. As is meant to be demonstrated by this illustrative view, embedded cooling channels may take on an infinite variety of shapes and sizes. For example channel 502 is a straight channel, channel 504 is a curved channel, and channel 506 is a double-curved channel.

Although various exemplary embodiments of the invention have been disclosed, it will be apparent to those skilled in the art that various changes and modifications can be made which will achieve some of the advantages of the invention without departing from the spirit and scope of the invention. It will be apparent to those reasonably skilled in the art that other components performing the same functions may be suitably substituted. The foregoing description of specific embodiments of the invention has been presented for the purposes of illustration and description. It is not intended to be exhaustive or to limit the invention to the precise forms disclosed, and many modifications and variations are possible in light of the above teachings. The embodiments were chosen and described to best explain the principles of the invention and its practical application, and to thereby enable others skilled in the art to best utilize the invention. It is intended that the scope of the invention be limited only by the claims appended hereto.

What is claimed is:

1. A cooler for components supported on a multi-layer circuit board, comprising:
   a channel formed in an interior layer of said multi-layer circuit board, wherein said channel extends under a locus for at least one of said components, and further comprising at least one thermal via extending through at least one layer of said multi-layer circuit board from said locus to said channel for conducting heat from said components to said channel;
   an inlet forming a conduit for cooling fluid from the exterior of the circuit board to the channel; and
   an outlet forming a conduit for cooling fluid from the channel to the exterior of the circuit board.

2. The cooler of claim 1 wherein the cooler comprises a plurality of channels formed in at least one layer of the multi-layer circuit board.

3. The cooler of claim 1 wherein the cooler comprises a plurality of channels formed in at least two layers of the multi-layer circuit board.

4. The cooler of claim 1, wherein voids are formed in two or more adjacent layers of the multi-layer circuit board and overlapped to form a single channel that is deeper than one that would be formed by a void in only one of the layers.

5. The cooler of claim 4, wherein the overlapping voids are of substantially the same size and shape and overlap for a substantial extent of their area.

6. The cooler of claim 1, wherein at least one of the layers comprises copper deposited on either side of a dielectric material.

7. The cooler of claim 6, wherein deposited copper forms at least one trace for the electrical connection of at least two electronic component leads.

8. The cooler of claim 6, wherein a layer containing a channel-forming void includes copper on at least one surface of a dielectric layer.

9. The cooler of claim 1, further comprising a pressure differential creator that encourages the flow of cooling fluid from a channel inlet to a channel outlet.

10. The cooler of claim 9, wherein the pressure-differential creator is a fluid pump.

11. The cooler of claim 1, wherein a channel's inlet and outlet are formed through the same layer.

12. The cooler of claim 1, wherein a channel's inlet and outlet are formed through opposite adjoining layers.

13. The cooler of claim 1, further comprising a plurality of inlets for a channel.

14. The cooler of claim 1, further comprising a plurality of outlets for a channel.

15. The cooler of claim 1 wherein the cooling channel is formed in an interior layer of a multi-layer circuit board.

16. A method of cooling components supported on a multi-layer circuit board, comprising the step of:
   forming a channel in an interior layer of said multi-layer circuit board, at least a portion of which channel is formed in close proximity to a locus for at least one component targeted for cooling;
   embedding at least one thermal via extending through at least one layer of said multi-layer circuit board, said thermal via extending from said locus to said channel;
   forming a conduit for cooling fluid from the exterior of the circuit board to the channel;
   forming a conduit for cooling fluid from the channel to the exterior of the circuit board; and
   flowing a cooling fluid through the inlet to the channel and out the outlet.

17. The method of cooling according to claim 16 further comprising the step of:
   forming a plurality of channels in at least one layer of the multi-layer circuit board.

18. The method of claim 17 further comprising the step of:
   forming a plurality of channels in at least two layers of the multi-layer circuit board.

19. The method of claim 17, further comprising the step of:
   forming voids in two or more adjacent layers of the multi-layer circuit board and overlapping the voids to form a single channel that is deeper than one that would be formed by a void in only one of the layers.

20. The method of claim 19, further comprising the step of:
   forming voids whereby the overlapping voids are of substantially the same size and shape and overlap for a substantial extent of their area.

21. The method of claim 17, further comprising the step of:
   forming circuit board layers whereby at least one of the layers comprises copper deposited on either side of a dielectric material.

22. The method of claim 21, further comprising the step of:
   depositing copper on a dielectric to form at least one trace for the electrical connection of at least two electronic component leads.

23. The method of claim 22, further comprising the step of:
   depositing copper on at least one surface of a dielectric material to form a layer within which a channel-forming void is formed.

24. The method of claim 16, further comprising the step of:
   creating a pressure differential that encourages the flow of cooling fluid from a channel inlet through a channel to a channel outlet.

25. The method of claim 24, wherein a fluid pump is employed to create a pressure-differential.

26. The method of claim 16, wherein the step of creating a channel's inlet and outlet comprises the step of forming the inlet and outlet through the same adjoining layer.

27. The method of claim 16, wherein the step of forming a channel's inlet and outlet comprises the step of forming the inlet and outlet through opposite adjoining layers.

28. The method of claim 16, further comprising the step of forming a plurality of inlets for a channel.

29. The method of claim 16, further comprising the step of forming a plurality of outlets for a channel.

* * * * *